US005770970A
:::

United States Patent [19]
Ikeda et al.

[11] Patent Number: 5,770,970
[45] Date of Patent: Jun. 23, 1998

[54] TRANSMITTER OF WIRELESS SYSTEM AND HIGH FREQUENCY POWER AMPLIFIER USED THEREIN

[75] Inventors: Hikaru Ikeda, Yokohama; Hiroaki Kosugi, Hirakata; Kaoru Ishida, Shijonawate; Nobuo Fuse, Moriguchi; Hideki Yagita, Yokohama; Hiroshi Haruki, Yokohama, all of Japan

[73] Assignee: Matsushita Electric Industrial Co., Ltd., Osaka, Japan

[21] Appl. No.: 705,244

[22] Filed: Aug. 30, 1996

[30] Foreign Application Priority Data

Aug. 30, 1995 [JP] Japan .................................. 7-221335

[51] Int. Cl.[6] .................. H03F 3/60; H03F 3/68
[52] U.S. Cl. .................... 330/286; 330/295; 330/302
[58] Field of Search ................ 330/53, 124 R, 330/286, 295, 302, 310, 54

[56] References Cited

U.S. PATENT DOCUMENTS 4,477,781 10/1984 Reuss .............................. 330/124 R X
4,803,443 2/1989 Takagi et al. ........................ 330/295 X
5,055,798 10/1991 Heinzelmann ......................... 330/295
5,661,434 8/1997 Brozovich et al. .................. 330/310 X

*Primary Examiner*—Steven J. Mottola
*Attorney, Agent, or Firm*—Ratner & Prestia

[57] ABSTRACT

The output of a digital modulator is put into a power amplifying device, is distributed into n pieces in an n-power divider in the power amplifier, passes through n input phase shifters differing individually in the phase change amount, is amplified by n power amplifiers, passes through n output phase shifters to match the phase of n signals, is combined in an n-power combiner, and is issued from an output terminal to a phase shifter, and the output of the phase shifter is issued to a transmission antenna. Herein, the phase value of the phase shifter is determined so as to extend the region of the output load impedance for satisfying the specific value of unwanted radiation, and so that the output load impedance range of the load impedance of the power amplifier may be optimize to the impedance change range of the trans missionantenna, thereby eliminating the isolator and presenting a transmitting device of a portable wireless system realizing smaller size, higher performance, and lower cost of portable wireless system.

4 Claims, 15 Drawing Sheets

TRANSMITTER OF WIRELESS SYSTEM AND HIGH FREQUENCY POWER AMPLIFIER USED THEREIN

FIELD OF THE INVENTION

The present invention relates to a transmitter for a wireless system mainly used in digital cellular phones or the like, and more particularly to a high frequency power amplifier used therein.

BACKGROUND OF THE INVENTION

Recently, the demand for cellular phones has increased, resulting in a need for effective utilization of available frequencies. In addition, smaller size and lower costs are demanded and conventional digital cellular phones have many problems to be solved. Referring to FIG. 1, an example of a conventional transmitter of a cellular phone using digital modulation is shown.

FIG. 1 shows a block diagram of a prior art transmitter of a digital cellular phone. In FIG. 1, a digital modulator 204 is connected to a power amplifier 203, which is in turn connected to a transmission antenna 201 through an isolator 202.

The operation of the prior art transmitter of the digital cellular phone shown in FIG. 1 is described below. A high frequency signal modulated by the digital modulator 204 is amplified by the power amplifier 203, and is transmitted from the antenna 201 through the isolator 202.

In such constitution of the prior art, however, in the cellular phone using digital modulation, such as quarter-pi-shifted (QPSK), code-division multiple access (CDMA) or the like, in order to control the adjacent channel power leakage (which is unwanted radiation included in the signal sent out from the antenna 201 below the value specified in Radio Wave Law) it is necessary to keep the output load impedance of the power amplifier 203 constant. The isolator 202 is designed to transmit the signal almost without attenuation in one direction, and absorb the opposite direction signal. Thereby, isolator 202 acts so as not to reflect the impedance change of the antenna 201 to the power amplifier 203. In the transmitter of the conventional digital cellular phone, to prevent the increase of unwanted radiation due to fluctuation of the load impedance of the high frequency power amplifier, it is necessary to have an expensive and large isolator. Such isolators have a large transmission loss.

SUMMARY OF THE INVENTION

An exemplary transmitter of the present invention comprises a phase shifter inserted within the transmission path between the antenna and the power amplifier. As a result, the output load impedance of the power amplifier including the antenna impedance may be optimized to the power amplifier, thereby resulting in minimal distortion.

By adjusting the phase value of the phase shifter, the load impedance of the power amplifier including the transmission antenna may be optimized, the operational distortion may be decreased, and the unwanted radiation may be minimized.

This constitution is further expanded into a constitution comprising a power amplifier for synthesizing the outputs of plural power amplifiers. In addition, each power amplifier has a different output load impedance phase.

In such constitution, the invention may expand the region of the output load impedance to satisfy the value of the specified unwanted radiation, by synthesizing the plural power amplifiers each having a different output load impedance phase.

A further exemplary embodiment may comprise a power amplifier using a final stage transistor which has a larger output power at the 1 dB gain compression point than the power which results by adding the gain Gp at the 1 dB gain compression point of the final stage transistor to the output power at the 1 dB gain compression point of the first stage transistor.

This may be effective to decrease the distortion of the power amplifier and minimize the unwanted radiation.

In this exemplary embodiment in order that the output load impedance of the power amplifier including the antenna impedance may be optimized for the power amplifier, a phase shifter may be inserted against the transmission antenna, and hence the expected effects may be further enhanced.

Thus, the invention may be capable of achieving a region of the output load impedance for minimizing the distortion of the power amplifying device and satisfying the desired unwanted radiation value without using an isolator.

EMBODIMENTS

In the following description of embodiments of the invention, examples of a cellular phone using digital modulation are presented.

Figure 1:
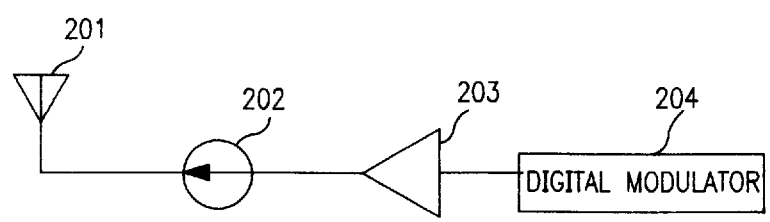
FIG. 1 is a block diagram of a conventional transmitter of a digital cellular phone.
Figure 2:
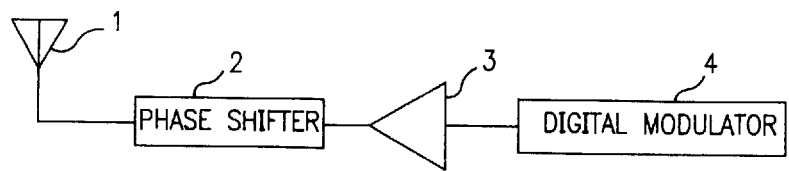
FIG. 2 is a block diagram of a transmitter in a first exemplary embodiment of the present invention.

A transmitter of a digital cellular phone in a first exemplary embodiment of the invention is described below while referring to the drawings. FIG. 2 is a block diagram of the transmitter of the digital cellular phone showing the first exemplary embodiment of the invention. In FIG. 2, a digital modulator 4 is connected to a power amplifier 3, and is further connected to a transmission antenna 1 through a phase shifter 2.

The operation of the transmitter of the digital portable cellular phone of FIG. 2 is described below. First, the impedance of the antenna 1 varies with the state of use of the cellular phone. For example, when placed in a free space, such as when held in a user's hand during call, or when put on a desk, the impedance of the antenna 1 varies. The range of change of the impedance of the antenna 1 when used as above is shown in shaded area in FIG. 3. It is shown in FIG. 3 that the impedance of the antenna is shifted in one phase direction.

Figure 4:
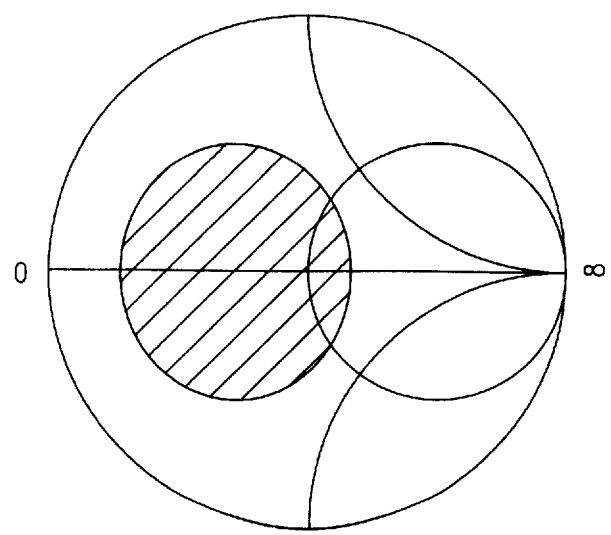
FIG. 4 is an output load impedance characteristic diagram for satisfying the specified value of unwanted radiation of a high frequency power amplifier in the transmitter of the first embodiment of the present invention.

The power amplifier using digital modulation such as QPSK and CDMA changes the distortion of the amplifier when the output load impedance varies. This results in a variation of the value of the unwanted radiation (especially adjacent channel leakage power) depending on the impedance change. FIG. 4 shows the output load impedance range for satisfying the value of unwanted radiation of the power amplifier. As is shown in FIG. 4, the output load impedance for satisfying the value of unwanted radiation of the power amplifier is shifted in a certain phase direction.

These results are applied to the transmitter of the digital cellular phone in FIG. 2. As a result, when the high frequency signal modulated by the digital modulator 4 is amplified by the power amplifier 3, and transmitted from the transmission antenna 1 through the phase shifter 2, the phase value of the phase shifter 2 is adjusted and set so that the impedance change range of the transmission antenna 1, as shown in FIG. 3, may be converted into the output load impedance range for satisfying the value of unwanted radiation for the power amplifier 3.

Figure 3:
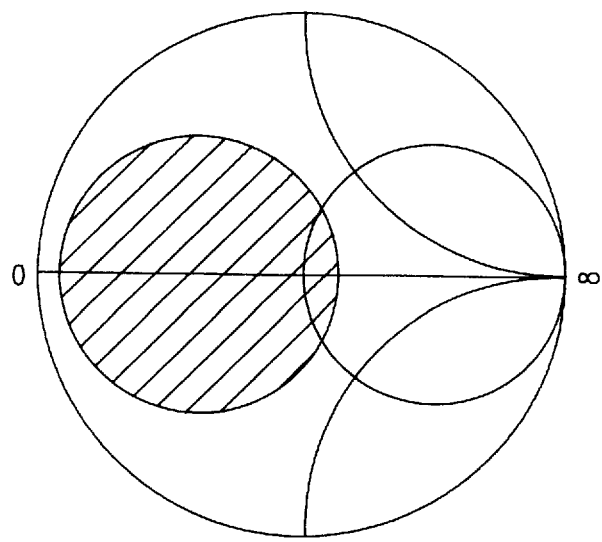
FIG. 3 is an antenna impedance characteristic diagram of various states of use of the transmitter of the first embodiment of the present invention.

By only setting the phase value of the phase shifter 2, the impedance change range of the antenna shown in FIG. 3 may not be sufficiently satisfy the output load impedance range of the power amplifier shown in FIG. 4. In this case, power it may be necessary for the power amplifier to use a wide output load impedance range to satisfy the value of the unwanted radiation. To broaden the output load impedance range for satisfying the value of unwanted radiation, the power amplifier may use a transistor which has a larger output power. The resulting distortion may be smaller, and hence the unwanted radiation may be smaller, so that the output load impedance range for satisfying the value of the unwanted radiation may be broader.

Thus, according to the exemplary embodiment, by optimizing the phase value of the phase shifter inserted between the power amplifier and transmission antenna, the isolator may be omitted, and may result in the cellular phone being smaller in size, higher in performance, and lower in cost.

Figure 5:
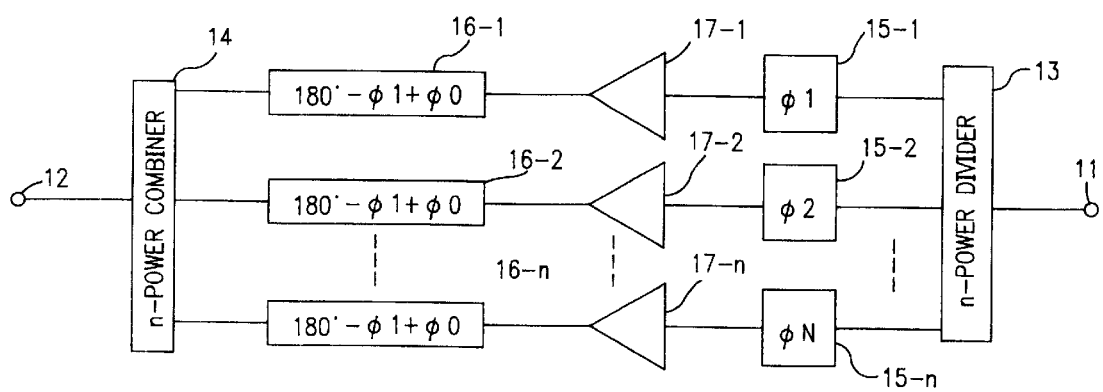
FIG. 5 is a block diagram of a high frequency power amplifier in a second exemplary embodiment of the present invention.

A second exemplary embodiment of the invention is described below by referring to the drawings. FIG. 5 is a block diagram of a high frequency power amplifier of a transmitter of a digital cellular phone in the second exemplary embodiment of the present invention. In FIG. 5, an input terminal 11 is connected to one input of an n-power divider 13 having n outputs with a unique phase change amount for each input, and n input phase shifters 15-1 to 15-n, each having a different phase change amount, connected to n outputs of the n-power divider 13, respectively.

The outputs of the input phase shifters 15-1 to 15-n are connected to output phase shifters 16-1 to 16-n through n power amplifiers 17-1 to 17-n, respectively. Power amplifiers 17-1 to 17-n each have identical characteristics. The outputs of n output phase shifters 16-1 to 16-n are connected to respective n inputs of an n-power combiner 14. The n-power combiner 14 has one output with a single phase change amount for the n inputs. The output of the n-power combiner 14 is connected to an output terminal 12.

Herein, the n output phase shifters 16-1 to 16-n are set so that the phase change amounts may be individually set to values, such as $(180°-\phi1+\phi0)$, $(180°-\phi2+\phi0)$, ..., $(180°-\phi n+\phi0)$. In these values, the phase change amounts of the n input shift phase shifters 15-1 to 15-n are $\phi1, \phi2, ..., \phi n$, and the fixed phase value is $\phi0$.

The operation of the high frequency power amplifier of the transmitter of the digital cellular phone of the second exemplary embodiment is described below. First, the high frequency signal entering the input terminal 11 is split into n signals by the n-power divider 13. These signals pass through the n input phase shifters 15-1 to 15-n with each of the n signals differing in their respective phase change amounts. The n signals are then amplified by n power amplifiers 17-1 to 17-n. The amplified n signals then pass through n output phase shifters 16-1 to 16-n to match the phases of the n signals to the input of the n-power combiner 14. The n signals are then combined in the n-power combiner 14, and issued from the output terminal 12.

Figure 6B:
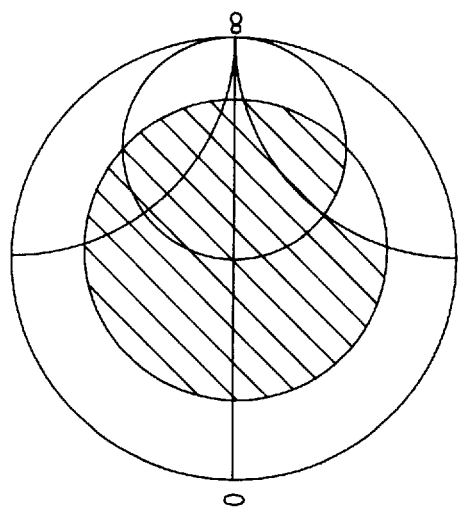
FIG. 6 is an output load impedance characteristic diagram of the high frequency power amplifier in the second exemplary embodiment of the present invention.
Figure 6A:
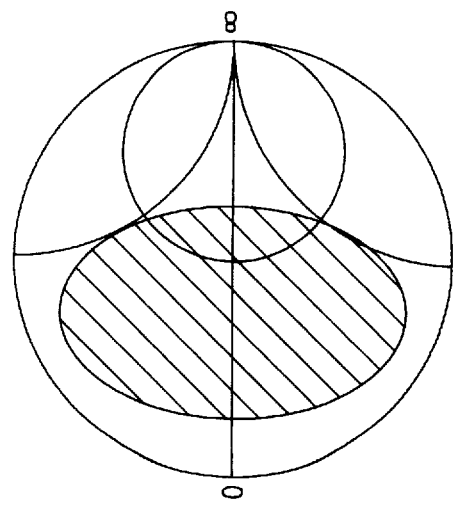

As shown in FIG. 4, in the power amplifiers 17-1 to 17-n, the output load impedance for satisfying the value of unwanted radiation is shifted in a certain impedance direction. Hence, by individually varying the phases of the output load impedances of the power amplifiers 17-1 to 17-n, and combining them, the region of the output load impedance for satisfying the value of the unwanted radiation may be extended as shown in FIG. 6a and FIG. 6b.

Thus, according to this exemplary embodiment, by synthesizing the outputs of the plural power amplifiers having respective output phase shifters each differing in the phase of the output load impedance, a high frequency power amplifier for expanding the region of the output load impedance for satisfying the value of unwanted radiation specified is realized.

In such constitution, it may be desirable that the load impedance of all power amplifiers of the plural power amplifiers satisfy the value of the unwanted radiation. However, if at least one power amplifier is set in a preferred load state, the distortion in the overall entire output may be lowered.

Herein, the high frequency power amplifier is defined to include an input phase shifter, power amplifier, output phase shifter and all others ranging from the power divider to the power combiner.

Figure 7:
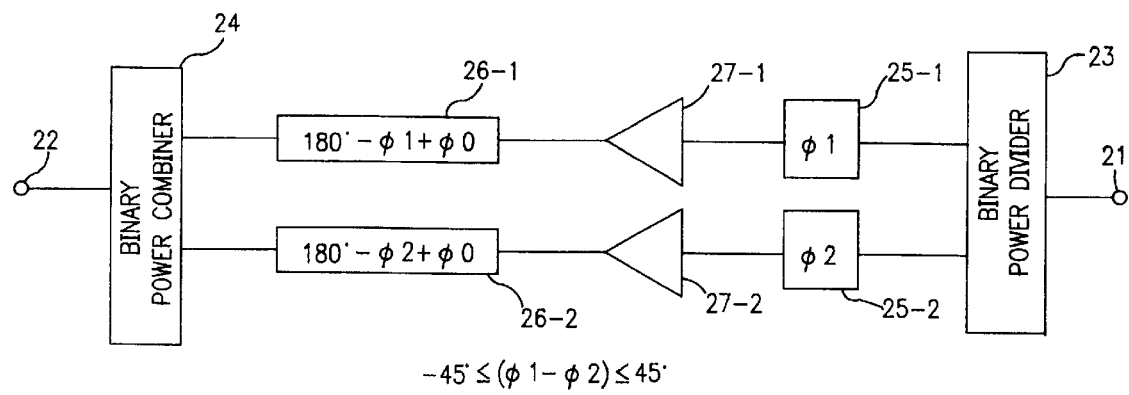
FIG. 7 is a block diagram of a high frequency power amplifier in a third exemplary embodiment of the present invention.

A third exemplary embodiment of the invention is described below by referring to the drawings. FIG. 7 is a block diagram of a high frequency power amplifier according to the third exemplary embodiment of the invention. In FIG. 7, an input terminal 21 is connected to a binary power divider 23. Binary power divider 23 has two outputs each having an identical phase change amount for any input. Two outputs of the binary power divider 23 are connected to input phase shifters 25-1 and 25-2 which have a difference between −45° and +45°(−45°≦(ø1−ø2)≦45°), where the individual phase change amounts to be are ø1 and ø2. Further, the two input phase shifters 25-1 and 25-2 are connected to two output phase shifters 26-1 and 26-2, which have respective phase change amounts of (180°−ø1+ø0) and (180°−ø2+ø0), where the fixed phase amount is ø0. The input phase shifters are connected to the output phase shifters through power amplifiers 27-1 and 27-2 each having identical characteristics. The two output phase shifters 26-1 and 26-2 are connected to respective inputs of a binary power combiner 24 having an identical phase change amount for each of the two inputs. The output of the binary power combiner 24 is connected to an output terminal 22.

The operation of the thus constituted high frequency power amplifier of the third exemplary embodiment is described below. First, a high frequency signal entering the input terminal 21 is divided into two signals by the binary power divider 23. These signals pass through the input phase shifters 25-1 and 25-2 each having a different phase change amount. The signals are then amplified by the power amplifiers 27-1 and 27-2. The amplified signals then pass through the output phase shifters 26-1 and 26-1 for matching the phase of the two signals to the inputs of the binary power combiner 24. The signals are then combined in the binary power combiner 24 and output through the output terminal 22.

Figure 8:
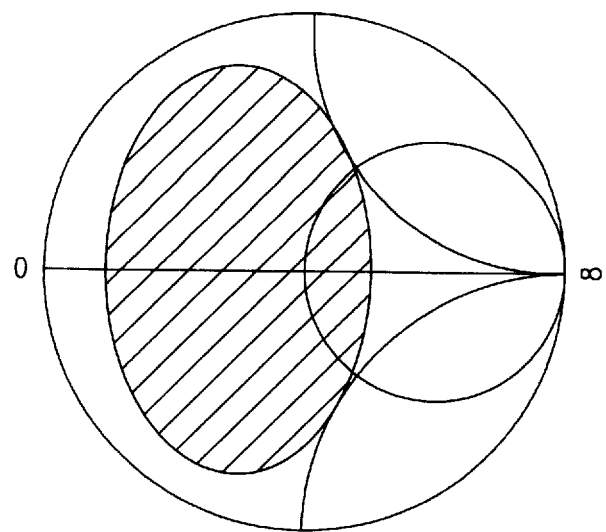
FIG. 8 is an output load impedance characteristic diagram of the high frequency power amplifier in the third exemplary embodiment of the present invention.

Thus, in the power amplifiers 27-1 and 27-1, as shown in FIG. 4, since the output load impedance for satisfying the value of unwanted radiation is shifted in a certain impedance direction, by individually varying the phases of the output load impedances of the two power amplifiers 27-1 and 27-1 (−45°≦(ø1−ø2)≦45°), the region of the output load impedance for satisfying the value of unwanted radiation may be extended as indicated by the shaded area in FIG. 8.

Thus, according to the embodiment, by combining the power and setting the phases of the output load impedances of the two power amplifiers to be (−45°≦(ø1−ø2)≦45°), the region of the output load impedance for satisfying the value of unwanted radiation can be extended.

Figure 9:
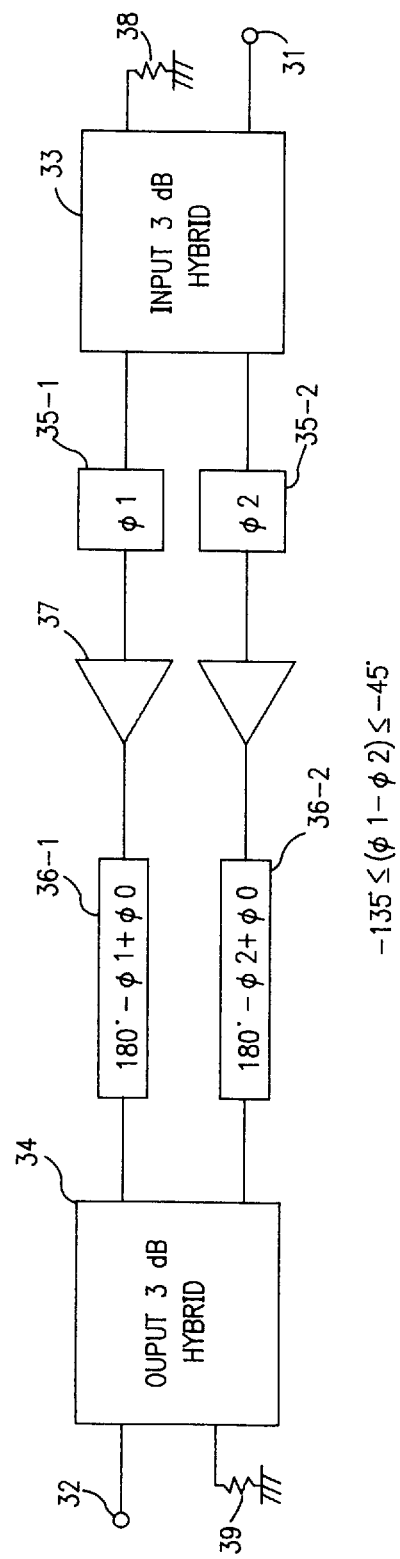
FIG. 9 is a block diagram of a high frequency power amplifier in a fourth exemplary embodiment of the present invention.

A fourth exemplary embodiment of the invention is described below by referring to the drawings. FIG. 9 is a block diagram of a high frequency power amplifier in the fourth exemplary embodiment of the invention. In FIG. 9, one terminal of an input 3 dB hybrid 33 is connected to an termination resistance 38, and the other terminal is connected to an input terminal 31. The two output terminals of the input 3 dB hybrid 33 differ in the phase change amount to the input terminal by 90°. One output terminal having a 90° phase difference is connected to an input phase shifter (ø1) 35-1, and the other output terminal is connected to an input phase shifter (ø2) 35-2.

The outputs of the two input phase shifters 35-1 and 35-2 are connected to two output phase shifters 36-1 and 36-2 which have respective phase change amounts of (180°−ø1+ø0) and (180°−ø2+ø0), where the fixed phase amount is ø0. One terminal of an output 3 dB hybrid 34 is connected to termination resistance 39, and the other terminal is connected to an output terminal 32. Two input terminals of the output 3 dB hybrid 34 differ in the phase change amount to the output terminal by 90°, and hence an input terminal having a phase change of 90° is connected to an output phase shifter (180°−ø2+ø0) 36-2, and the other input terminal is connected to an output phase shifter (180°−ø1+ø0) 36-1. In these two input phase shifters 35-1 and 35-2, it is assumed that the phase change amounts are ø1 and ø2, and the difference of the phase change amount is (−135°≦(ø1−ø2≦−45°).

The operation of the thus constituted high frequency power amplifier is described below. First, a high frequency signal entering the input terminal 31 is divided into two signals by the input 3 db hybrid 33. These signals pass through the input phase shifters 35-1 and 35-2, each phase shifter having a different phase change amount, and are amplified in the power amplifiers 37-1 and 37-2. The signals then pass through the output phase shifters 36-1 and 36-2 to match the phase of the two signals to the inputs of the output 3 dB hybrid 34. The signals are then combined by the output 3 dB hybrid 34 and output through the output terminal 32.

Thus, in the power amplifiers 37-1 and 37-2, as shown in FIG. 4, since the output load impedance for satisfying the value of unwanted radiation is shifted in a certain impedance direction, based on the phase change amount of the output 3 dB hybrid 34 and the phases of the output phase shifters, the phases of the output load impedances of the two power amplifiers 37-1 and 37-2 are individually different (−45°≦(ø1−ø2)≦45°), and therefore the region of the output load impedance for satisfying the value of unwanted radiation may be extended as indicated by the shaded area in FIG. 8. Moreover, by using the 3 dB hybrid, the impedance match of the high frequency amplifying device as seen from the input terminal 31 and output terminal 32 is improved.

Thus, according to the embodiment, by synthesizing the power by setting the phases of the output load impedances of the two power amplifiers to be (−(45°≦(ø1−ø2)≦45°), the region of the output load impedance for satisfying the value of unwanted radiation may be extended. In addition, the input to output impedance of the entire power amplifier may be improved.

Figure 10:
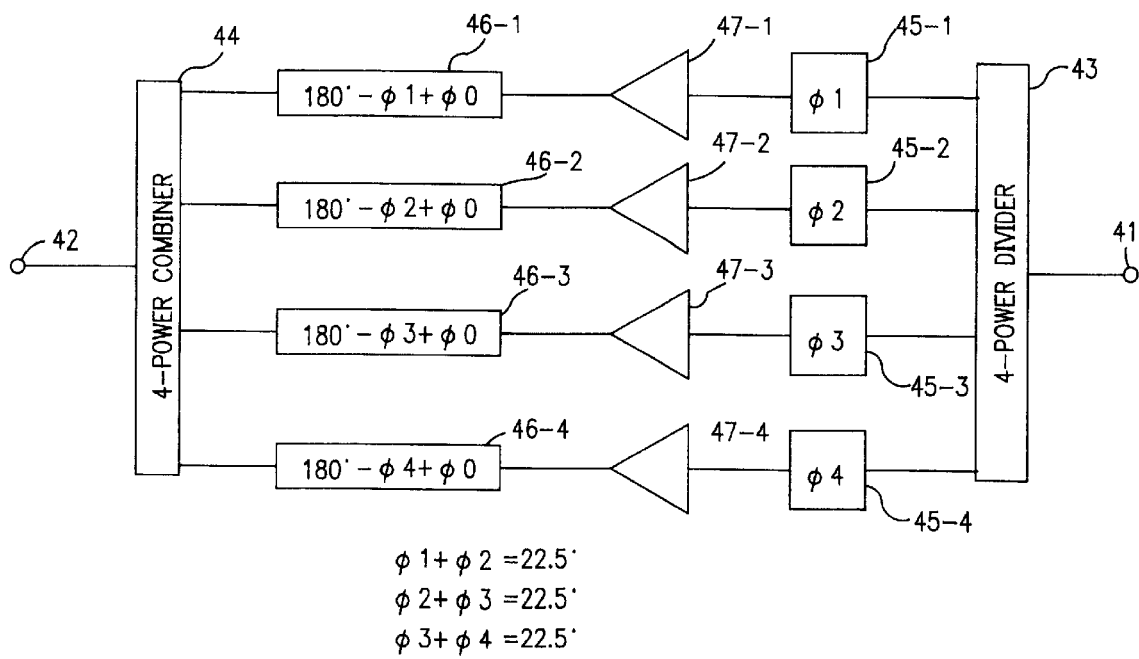
FIG. 10 is a block diagram of a high frequency power amplifier in a fifth exemplary embodiment of the present invention.

A fifth exemplary embodiment of the invention is described below while referring to the drawings. FIG. 10 is a block diagram of a high frequency power amplifier in the fifth embodiment of the invention. In FIG. 10, an input terminal 41 is connected to one input of a 4-splitter 43 with four outputs where each output has an identical phase change amount for any given input. Input phase shifters 45-1 to 45-4 are connected to the four outputs of the 4-splitter 43, respectively. Moreover, output phase shifters 46-1 to 46-4 are connected to the respective outputs of the four input phase shifters 45-1 to 45-4 through four power amplifiers 47-1 to 47-4, each amplifier having similar characteristics. The outputs of the four output phase shifters 46-1 to 46-4 are connected to four inputs of a 4-combiner 44 respectively. Each phase shifter having one output of the same phase change amount for the four inputs. The one output of the 4-combiner 44 is connected to an output terminal 42.

Herein, assuming that the phase change amounts of the four input phase shifters 45-1 to 45-4 are ø1, ø2, ø3, and ø4, respectively, the difference in the phase amount is 22.5 degrees, respectively. In the four output phase shifters 46-1 to 46-4, the phase change amounts are (180°−ø1+ø0), (180°−ø2+ø0), (180°−ø3+ø0), and (180°−ø4+ø0), respectively, where ø0 is the fixed phase amount.

The operation of the thus constituted high frequency power amplifier is described below. First, a high frequency signal input at input terminal 41 is divided into four signals by the 4-splitter 43. These signals pass through the input phase shifters 45-1 to 45-4 which differ in the phase change amount. The signals are then amplified by the power amplifiers 47-1 to 47-4. The amplified signals then pass through the output phase shifters 46-1 to 46-4 to match the phase of the four signals to the inputs of the quarter power combiner 44. The signals are then combined in the quarter power combiner 44 and output through the output terminal 42.

Thus, in the power amplifiers 47-1 to 47-4, as shown in FIG. 4, since the output load impedance for satisfying the value of unwanted radiation is shifted in a certain impedance direction, by varying the phases of the output load impedances of the four power amplifiers 47-1 to 47-4 by 22.5° each, the region of the output load impedance for satisfying the value of unwanted radiation may be extended in all phase directions as shown in FIG. 6 (*b*).

Thus, according to the embodiment, by synthesizing the power by setting the phases of the output load impedances of the four power amplifiers to differ by 22.5° each, the region of the output load impedance for satisfying the value of unwanted radiation can be extended.

Figure 11:
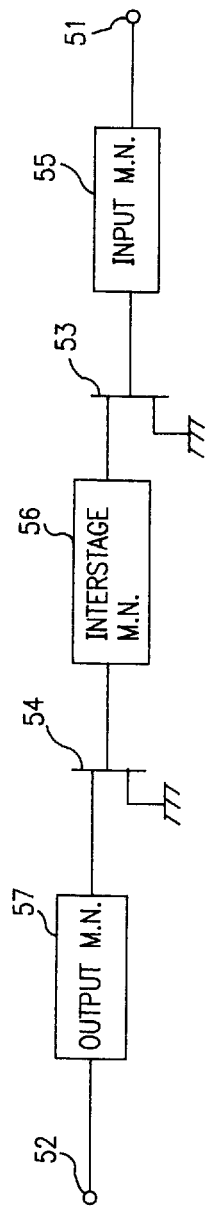
FIG. 11 is a block diagram of a high frequency power amplifier in a sixth exemplary embodiment of the present invention.

A sixth exemplary embodiment of the invention is described below by referring to the drawings. FIG. 11 is a block diagram of a high frequency power amplifier in the sixth embodiment of the invention. In FIG. 11, an input terminal 51 is connected to the input of an input matching circuit 55, the output of the input matching circuit 55 is connected to the input of a first stage transistor 53, the output of the first stage transistor 53 is connected to the input of a fmal stage transistor 54 through an interstage matching circuit 56, the output of the final stage transistor 54 is connected to the input of an output matching circuit 57, and the output of the output matching circuit 57 is connected to an output terminal 52.

The operation of this exemplary constituted high frequency power amplifier is described below. First, a high frequency signal entering the input terminal 51 passes through the input matching circuit 55 and is amplified by the first stage transistor 53. The amplified signal passes through the interstage matching circuit 56, is amplified again in the fmal stage transistor 54, passes through the output matching circuit 57, and is issued from the output terminal 52.

Figure 12:
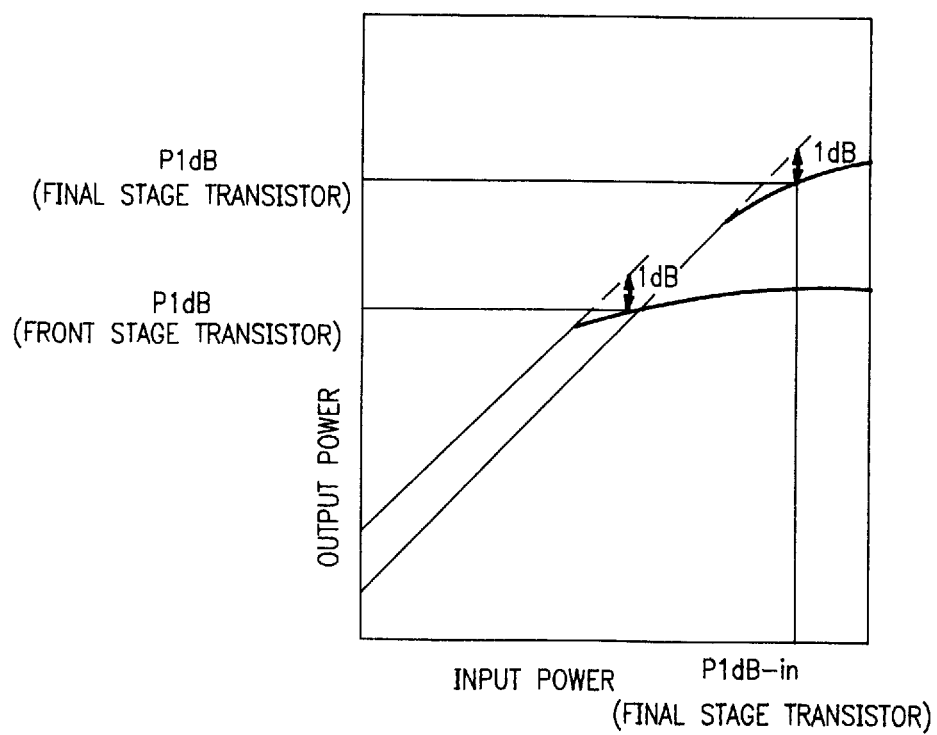
FIG. 12 is an input to output characteristic of a first stage transistor and final stage transistor in the transmitter of the sixth exemplary embodiment of the present invention.

The input to output characteristics of the first stage transistor 53 and final stage transistor 54 are shown in FIG. 12. In FIG. 12, the gain of the fmal stage transistor 54 at the 1 dB gain compression point (the point of 1 dB compression of gain due to saturation of the output power) is assumed to be Gp. The fmal stage transistor 54 is selected so that it has a larger output power at the 1 dB gain compression point than the power resulting from adding the gain Gp to the output power at the 1 dB gain compression point of first stage transistor 53.

Figure 13:
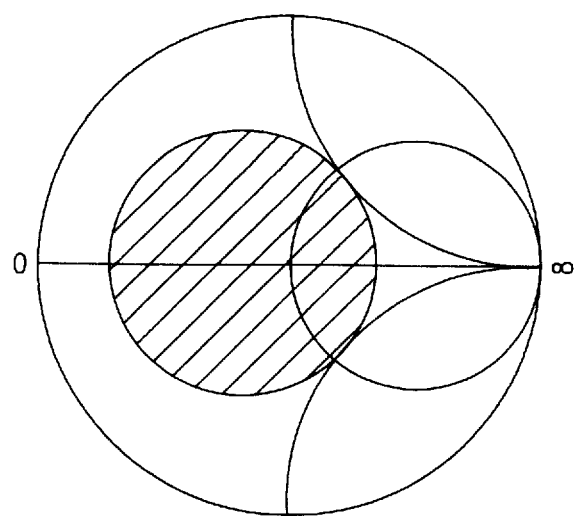
FIG. 13 is an output load impedance characteristic of the amplifier in the sixth exemplary embodiment of the present invention.

In this constitution, for fmal stage transistor 54, a transistor larger in output power than the fmal stage transistor of the conventional amplifier constitution is used. Furthermore, the greater the difference between the maximum output and normal output of the transistor, the wider the range of the output load impedance may be extended, satisfying the value of unwanted radiation as shown in FIG. 13. However, the transistor having a larger output power generally has a poor DC to AC power efficiency. Therefore, the transistors used before the fmal stage are the same as in the conventional constitution.

Thus, according to the embodiment, in the applicable frequency band, where the gain at the 1 dB gain compression point of the fmal stage transistor is assumed to be Gp, by selecting the I/O power characteristics of the transistors so that it has a larger output power at the 1 dB gain compression point than the power that results from adding the gain Gp to the output power at the 1 dB gain compression point of first stage transistor 53, the region of the output load impedance for satisfying the value of unwanted radiation may be extended. This is because the final stage transistor is not saturated before the first stage transistor is saturated.

Figure 14:
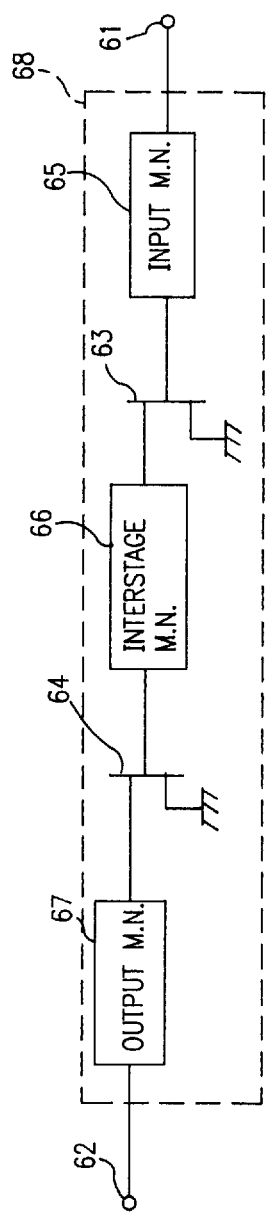
FIG. 14 is a block diagram of a high frequency power amplifier in a seventh exemplary embodiment of the present invention.

A seventh embodiment of the invention is described below while referring to the drawings. FIG. 14 is a block diagram of a high frequency power amplifier in the seventh exemplary embodiment of the present invention. In FIG. 14, an input terminal 61 is connected to the input of an input matching circuit 65. The output of the input matching circuit 65 is connected to the input of a first stage transistor 63. The output of the first stage transistor 63 is connected to the input of a final stage transistor 64 through an interstage matching circuit 66. The output of the final stage transistor 64 is connected to the input of an output matching circuit 67, and the output of the output matching circuit 67 is connected to an output terminal 62. The constitution in the block diagram is similar to that shown in FIG. 11 relating to the sixth embodiment, except that the area 68 is composed in a monolithic microwave integrated circuit (MMIC).

The operation of the embodiment is the same as in the sixth embodiment shown in FIG. 11. According to the embodiment, in the applicable frequency band, where the gain at the 1 dB gain compression point of the final stage transistor is Gp, by selecting the I/O power characteristics of the transistors such that it has a larger output power at the 1 dB gain compression point than the power which results from adding the gain Gp to the output power at the 1 dB gain compression point of the first stage transistor 53, the fmal stage transistor may not be saturated before the first stage transistor is saturated. Therefore, the region of the output load impedance for satisfying the value of unwanted radiation may be extended. Furthermore, the circuit is composed in a smaller size by forming a high frequency monolithic IC.

Figure 15:
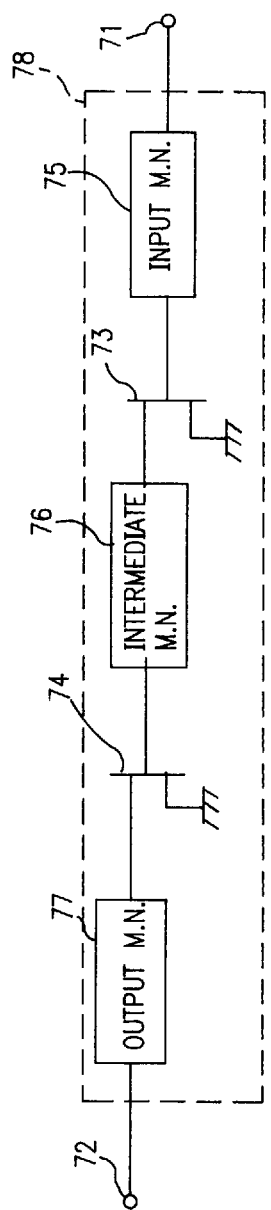
FIG. 15 is a block diagram of a high frequency power amplifier in an eighth exemplary embodiment of the present invention.

An eighth embodiment of the invention is described below while referring to the drawings. FIG. 15 is a block diagram of a high frequency power amplifier in the eighth exemplary embodiment of the invention. In FIG. 15, an input terminal 71 is connected to the input of an input matching circuit 75. The output of the input matching circuit 75 is connected to the input of a first stage transistor 73. The output of the first stage transistor 73 is connected to the input of a fmal stage transistor 74 through an interstage matching circuit 76. The output of the fmal stage transistor 74 is connected to the input of an output matching circuit 77, and the output of the output matching circuit 77 is connected to an output terminal 72. The constitution in the block diagram is same as in FIG. 11 relating to the sixth embodiment, except that the area 78 is composed in a monolithic microwave integrated circuit (MMIC).

The operation of the embodiment is the same as in the sixth embodiment shown in FIG. 11. According to the embodiment, in the applicable frequency band, where the gain at the 1 dB gain compression point of the fmal stage transistor is assumed to be Gp, by selecting the I/O power characteristics of the transistors so that it has a larger output power at the 1 dB gain compression point than the power that results from adding the gain Gp to the output power at the 1 dB gain compression point of first stage transistor 53, the region of the output load impedance for satisfying the value of unwanted radiation can be extended. This is because the final stage transistor is not saturated before the first stage transistor is saturated. Moreover, the circuit is composed in a smaller size by forming a high frequency monolithic IC. Furthermore, by forming the output matching circuit 77 as an externally fitted matching circuit, the loss of the output matching circuit 77 is decreased as compared with the high frequency monolithic IC, so that the efficiency of the power amplifying device may be enhanced. This is because formation of a matching circuit on the high frequency monolithic IC results in a smaller size, but increases the loss since the line width of the inductance and transmission line becomes thinner, thereby increasing of inductance.

Figure 16:
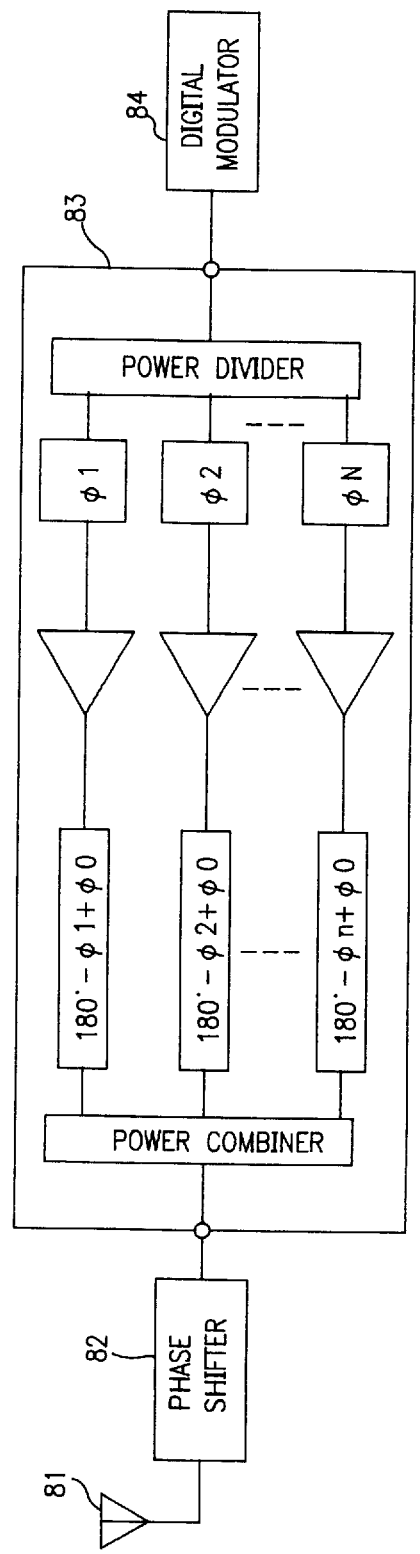
FIG. 16 is a block diagram of a transmitter in any one of a ninth to fifteenth exemplary embodiment of the present invention.

The ninth to fifteenth exemplary embodiments of the invention are described below while referring to the drawings. FIG. 16 is a block diagram of a transmitter of a digital portable wireless device showing any one of the ninth to fifteenth embodiments of the invention. In FIG. 16, the output of a digital modulator 84 is connected to a power amplifier 83. The output of the power amplifier 83 is connected to a transmission antenna 81 through a phase shifter 82. The power amplifier 83 herein is the same as the power amplifier in FIG. 5, and it is the power amplifying device extended in the region of output load impedance for satisfying the value of unwanted radiation by the means as shown in FIGS. 5, 7, 9, 10, 11, 14, and 15 in the second to eighth embodiments. This constitution is same as in the first embodiment.

The operation of the thus constituted transmitter of a digital portable cellular phone is the same as in the first embodiment. According to the embodiment, therefore, by optimizing the phase value of the phase shifter inserted between the power amplifier and antenna, the isolator may be omitted. Resulting in a smaller, higher performance, and lower cost cellular phone.

Incidentally, in the sixth, seventh and eighth embodiments, transistors are provided in two stages. However, by adding transistors to the input terminal side, multiple stages may also be composed.

The input matching circuit may be eliminated in the sixth, seventh and eighth embodiments.

In the second embodiment, phase shifters differing in phase are inserted between the input and output units of the n amplifiers. Instead of the phase shifters, however, the circuit may be designed to vary the phase of the output terminal and amplifier by providing the function of phase shifter within the n-power divider and n-power combiner.

Also in the second embodiment, the phase change amounts of each input to output of the n-power divider and n-power combiner are constant. However, by using the n-power divider or n-power combiner having different phase change amounts in each input to output, the circuit may also be designed to compensate for the phase change amount of each phase shifter.

A Wilkinson power divider and 3 dB hybrid may be used as the n-power divider and n-power combiner in the second embodiment, respectively.

As described herein, according to the invention, by minimizing the distortion of the output by adjusting the phase value of the phase shifter inserted between the power amplifier and antenna, using the power amplifier combining the outputs of plural power amplifiers differing individually in the phase of the output load impedance, using a semiconductor device in the power amplifier which is larger in output power than in first stage in the final stage device, and adjusting the phase shifter setting to optimize the output load impedance of the power amplifier including the antenna impedance between it and the transmission antenna, it is possible to present a transmitter in, for example, a portable wireless system, which is capable of extending the region of output load impedance satisfying the specified value of unwanted radiation even with omitting the isolator, so that a smaller size, higher performance, and lower cost of portable cellular phone may be realized.

In the description of the foregoing embodiments of the invention, the digital cellular phone is presented, but it may be applied to different modulation methods mostly or further to non-portable wireless system although portable wireless systems mostly demand such technical application Numerical values and details of constitution in the illustrated embodiments are only examples, and may be hence varied within the scope of the invention.

As the invention may be embodied in several forms without departing from the spirit of essential characteristics thereof, the present embodiments are therefore illustrative and not restrictive. Since the scope of the invention is defined by the appended claims rather than by the description preceding them, and all changes that fall within metes and bounds of the claims, or equivalence of such metes and bounds thereof are therefore intended to be embraced by the claims.

What is claimed is:

1. A high frequency power amplifier of transmitting device of wireless system comprising:

an n-power divider having n outputs of same phase change amounts for one input, n input phase shifters for receiving the outputs of said n-power divider, of which phase change amounts are respectively $\phi 1, \phi 2, \ldots \phi n$, n power amplifiers having same characteristics, for receiving the outputs of said n input phase shifters, n output phase shifters for receiving the corresponding outputs of said n power amplifiers corresponding to said input phase shifters, of which phase change amounts are respectively $(180°-\phi 1+\phi 0)$, $(180°-\phi 2+\phi 0, \ldots, (180°-\phi n+\phi 0)$, with the fixed phase amount to be $\phi 0$, and an n-power combiner having same phase change amounts for n inputs from said n output phase sifters, and having one output by synthesizing n inputs.

2. A high frequency power amplifier of transmittingdevice of wireless system of claim 1, wherein n is 2, and the condition of $(-45°\leq(\phi 1-\phi 2)\leq 45°)$ is satisfied, supposing the phase change amounts of the input phase shifters to be $\phi 1$ and $\phi 2$.

3. A high frequency power amplifier of transmitting device of wireless system of claim 1, wherein n is 4, and a parallel connection is composed with the phase change amount of eachinput phase shifter being 22.5°.

4. A high frequency power amplifier of transmitting device of wireless system comprising:

an input 3 dB hybrid possessing two inputs and two outputs, with phase change amount differing by 90° from one to other of two outputs, two input phase shifters satisfying the condition of $(-45°\leq(\phi 1-\phi 2)\leq 45°)$, supposing the phase change amounts to be $\phi 1$ and $\phi 2$, by receiving the outputs from said input 3 dB hybrid, two power amplifiers having same characteristics, for receiving the outputs of said two input phase shifters, two output phase shifters for receiving the corresponding outputs of said two power amplifiers corresponding to said two input phase shifters, of which phase change amounts are respectively $(180°-\phi 1+\phi 0)$ and $(180°-\phi 2+\phi 0)$, with the fixed phase amount to be $\phi 0$, and an output 3 dB hybrid possessing two inputs and two outputs, with phase change amount differing by 90° from one to other of two inputs, wherein one of two inputs of said input 3 dB hybrid is connected to an input terminal, other is terminated at an end resistance, one of two outputs having a phase change of 90° is connected to the input phase shifter (ø1), the other is connected to the input phase shifter (ø2), the input side with phase change of 90° is connected to the input of the output phase shifter (180°−ø1+ø0) and the other is connected to the input of the output phase shifter (180°−ø2+ø0) to the two input phase shifters through the power amplifiers respectively, one output of the output 3 dB hybrid is terminated at an termination resistance, the other output is connected to the output terminal, the output of the output phase shifter (180°−ø2+ø0) is connected to the input having phase change of 90° of the output 3 dB hybrid, and the output of the output phase shifter (180°−ø1+ø0) is connected to the other input of the output 3 dB hybrid, thereby satisfying the condition of (−135°≦(ø1−ø2)≦−45°).

* * * * *

UNITED STATES PATENT AND TRADE MARK OFFICE
CERTIFICATE OF CORRECTION

PATENT NO.   : 5,770,970
DATED        : June 23, 1998
INVENTOR(S)  : Ikeda et al.

It is certified that error appears in the above-identified patent and that said Letters Patent is hereby corrected as shown below:

Cover page, item [57] ABSTRACT, line 14, "optimize" should be --optimized--.

Cover page, item [57] ABSTRACT, line 14, "trans" should be "trans-"

Cover page, item [57] ABSTRACT, line 15, "missionantenna" should be --mission antenna--.

Column 10, line 39, "transmittingdevice" should be --transmitting device--.

Column 10, line 47, "eachinput" should be --each input--.

Col. 12, line 1, "an" should be --a--.

Signed and Sealed this

Fifteenth Day of December, 1998

Attest:

BRUCE LEHMAN

*Attesting Officer*   Commissioner of Patents and Trademarks